United States Patent [19]
Fassett et al.
[11] 4,088,970
[45] May 9, 1978

[54] PHASE SHIFTER AND POLARIZATION SWITCH

[75] Inventors: Matthew Fassett, Billerica; Russell W. Hansen, Stoughton; John F. Toth, Billerica; Pietro Ventresca, Littleton, all of Mass.

[73] Assignee: Raytheon Company, Lexington, Mass.

[21] Appl. No.: 661,676

[22] Filed: Feb. 26, 1976

[51] Int. Cl.[2] .......................... H03H 7/20; H01P 1/18; H01P 5/16; H01P 9/00

[52] U.S. Cl. .......................... 333/31 R; 333/11; 343/854

[58] Field of Search .................. 333/31 A, 31 R, 7 R, 333/7 D, 84 M, 84 R, 10–11; 343/795, 854, 797

[56] References Cited

U.S. PATENT DOCUMENTS

| | | | |
|---|---|---|---|
| 3,246,265 | 4/1966 | Smith-Vaniz | 333/31 R |
| 3,321,717 | 5/1967 | Harper | 333/7 D |
| 3,400,405 | 9/1968 | Patterson, Jr. | 333/31 R X |
| 3,611,199 | 10/1971 | Safran | 333/31 R X |
| 3,710,145 | 1/1973 | Williamson et al. | 333/31 R |
| 3,725,943 | 4/1973 | Spanos | 343/797 |

OTHER PUBLICATIONS

White–"Diode Phase Shifters for Array Antennas", pub. by Microwave Associates Copywright 1974, pp. 1–19.

Flaherty– "Prevent Polarization Fading", in Electronic Design, No. 7, vol. 19, Aug. 16, 1971, pp. 68–69.

*Primary Examiner*—Alfred E. Smith
*Assistant Examiner*—Marvin Nussbaum
*Attorney, Agent, or Firm*—Philip J. McFarland; Joseph D. Pannone

[57] ABSTRACT

An octave band phase shifter/polarization switch is disclosed which is comprised of a plurality of serially coupled phase bits arranged to provide, in combination, a four bit phase shifter and a polarization switch capable of providing any selected one of six separate polarization senses. The device is fabricated in a stripline package and each of the phase bits is comprised of a hybrid coupler whose output ports are terminated in switchable reactances. Either packaged microwave P-I-N or N-I-P diodes are utilized as the switchable reactances, and bias voltage for the diodes is provided by means of an octave band choke, comprising a dielectrically loaded coil disposed within a center dielectric layer of the stripline package.

3 Claims, 6 Drawing Figures

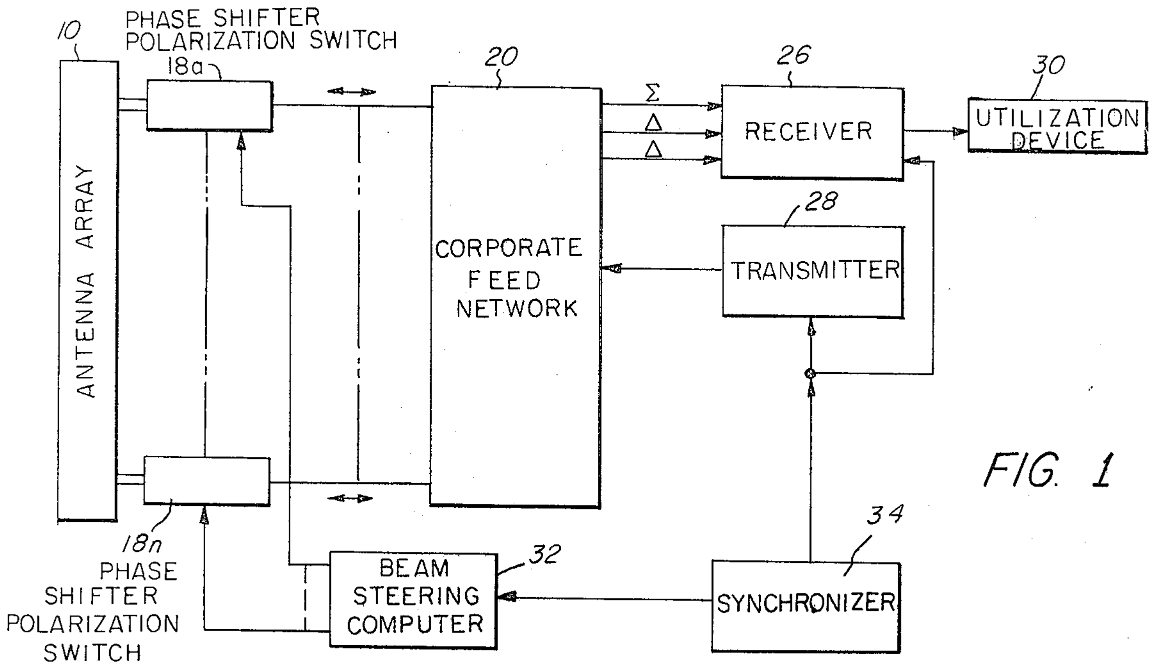
FIG. 1
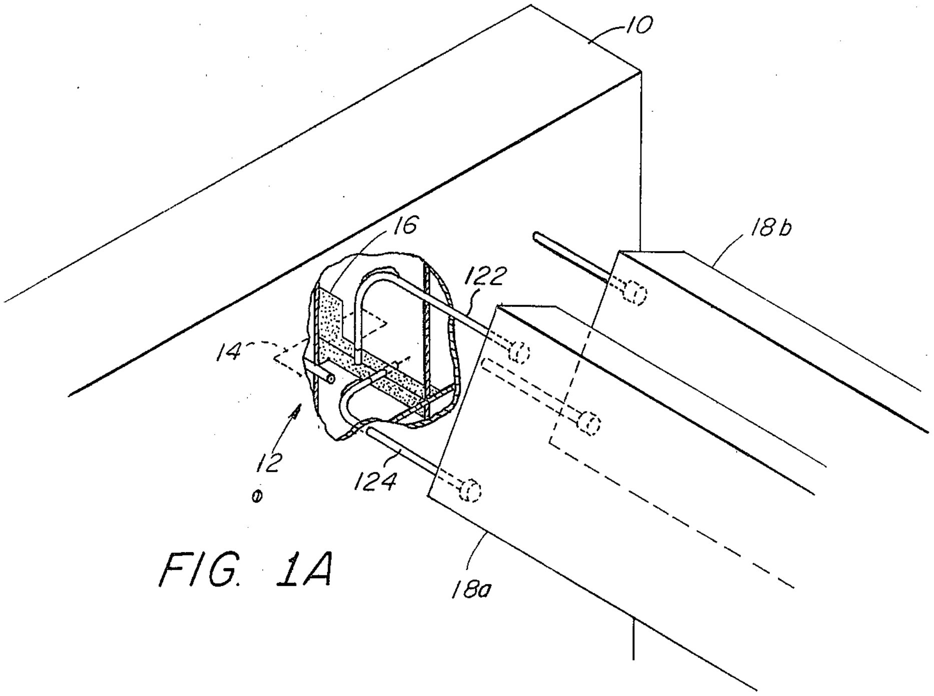
FIG. 1A
FIG. 4
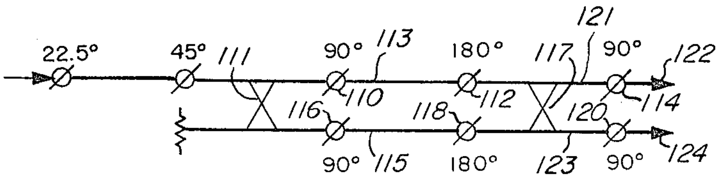

PHASE SHIFTER AND POLARIZATION SWITCH

The invention herein described was made in the course of, or under a contract or subcontract thereunder, with the Department of Defense.

BACKGROUND OF THE INVENTION

This invention relates generally to devices for controlling the phase and polarization of microwave signals and more particularly to a combination phase shifter/polarization switch adapted to operate over an octave bandwidth.

As is known in the art, a collimated beam of radio frequency energy may be formed and steered by controlling the phase of the energy radiated from each one of a plurality of antenna elements in an array thereof. The two principal means of providing electronic control of the phase of microwave signals are realized by diode and ferrite phase shifters. Ferrite phase shifters present a nearly uniform propagation medium to microwave signals passing therethrough, and therefore they are capable of operating over a relatively wide bandwidth. However, ferrite phase shifters are nonreciprocal and in situations where polarization diversity is desired, such as in ECM applications, additional elements such as nonreciprocal polarizers and switchable quarter-wave plates must be combined with the ferrite phase shifter. The use of such nonreciprocal polarizers and switchable quarter-wave plates, while adequate in many applications, has been found to be inadequate when it is required that the devices operate over a relatively wide frequency band. This is so because the bandwidth of the phase shifter will be limited to that of the switchable quarter-wave plate and will, therefore, be limited to approximately a 20 percent band. Such a device is, therefore, impractical in applications wherein it is required that the devices have greater than an octave bandwidth as in ECM and ECCM applications. Additionally, the extra size and weight required by ferrite phase shifters to provide polarization diversity makes the use of such devices impractical in airborne phased array applications.

As is known in the art, diode phase shifters are attractive for airborne phased array applications because they are lightweight, temperature insensitive, and are capable of high speed switching rates. Diode polarizers may be formed from 90 and 180 degree phase bits and therefore polarization diversity may be readily integrated into the phase shifter design. Diode phase shifters are, however, relatively bandwidth limited. One known diode phase shifter is described in an article entitled "A Low Cost P-I-N Diode Phase Shifter For Airborne Phased Array Antennas" by F. G. Terrio, R. J. Stockton and W. D. Sato, IEEE Transactions on Microwave Theory and Techniques, June 1974, pages 688–692. In such phase shifter pin diode chips were used as the switching elements, and the useful bandwidth of such device, allowing a maximum phase error of $\pm$ 22.5°, is 40 percent. In the same device for a maximum permissible phase error of 35 10°, the bandwidth is about 30 percent.

In airborne applications it is desirable to employ hermetically sealed semiconductor packages so that potting or sealing is not required to protect the diodes. The use of packaged diodes further reduces the bandwidth of the phase shifter due to the parasitic reactances which the diode package adds to the circuit, as is reported in an article entitled "Diode Phase Shifters For Array Antennas" by J. F. White, IEEE Transactions on Microwave Theory and Techniques, June 1974, pages 658–674. Additionally, high frequency phase shifter circuits, fabricated using stripline or microstrip techniques, usually employ ground plane spacings less than 0.100 inches in order to suppress higher order modes. Since the length of a standard diode package is greater than twice the ground plane spacing, the use of packaged diodes in high frequency phase shifter circuits has been impractical. Obviously, such considerations make it extremely difficult to provide a diode phase shifter employing packaged pin diodes and having an octave bandwidth.

SUMMARY OF THE INVENTION

With this background of the invention in mind, it is an object of this invention to provide an improved diode phase shifter which is adapted to operate over an octave bandwidth.

It is another object of this invention to provide an integrated phase shifter/polarization switch employs packaged P-I-N diodes as the switching elements and which is suitable for airborne applications.

These and other objects of the invention are attained generally by providing a device comprising a series of quarter-wave overlay couplers, each of whose coupled arms is terminated by a switchable reactance. In a preferred embodiment of the invention, the couplers are fabricated in a stripline package and the switchable reactances are provided by means of packaged P-I-N diodes mounted at right angles to the stripline boards. A first terminal of each of said diodes is connected to the stripline center conductor and a second terminal is terminated in a short circuit formed external to the stripline package. The packaged P-I-N diodes then form the center conductors of sections of coaxial lines which, in turn, are terminated in short circuits. Means are provided to bias said diodes to provide the desired phase shift and/or polarization sense through the device.

BRIEF DESCRIPTION OF THE DRAWINGS

The foregoing features of this invention, as well as the invention itself, may be more fully understood from the following detailed description read together with the accompanying drawings in which:

FIG. 1 is a simplified sketch of an airborne radar system using an array of antenna elements, each one thereof being connected to a diode phase shifter/polarization switch, to radiate a collimated beam of radio frequency energy;

FIG. 1A is an isometric view, partially cut away, of the antenna array of FIG. 1 showing a phase shifter/polarization switch affixed to an element thereof;

FIG. 4 is a schematic diagram useful in the understanding of the invention.

DESCRIPTION OF THE PREFERRED EMBODIMENT

Figures 2, 2A:
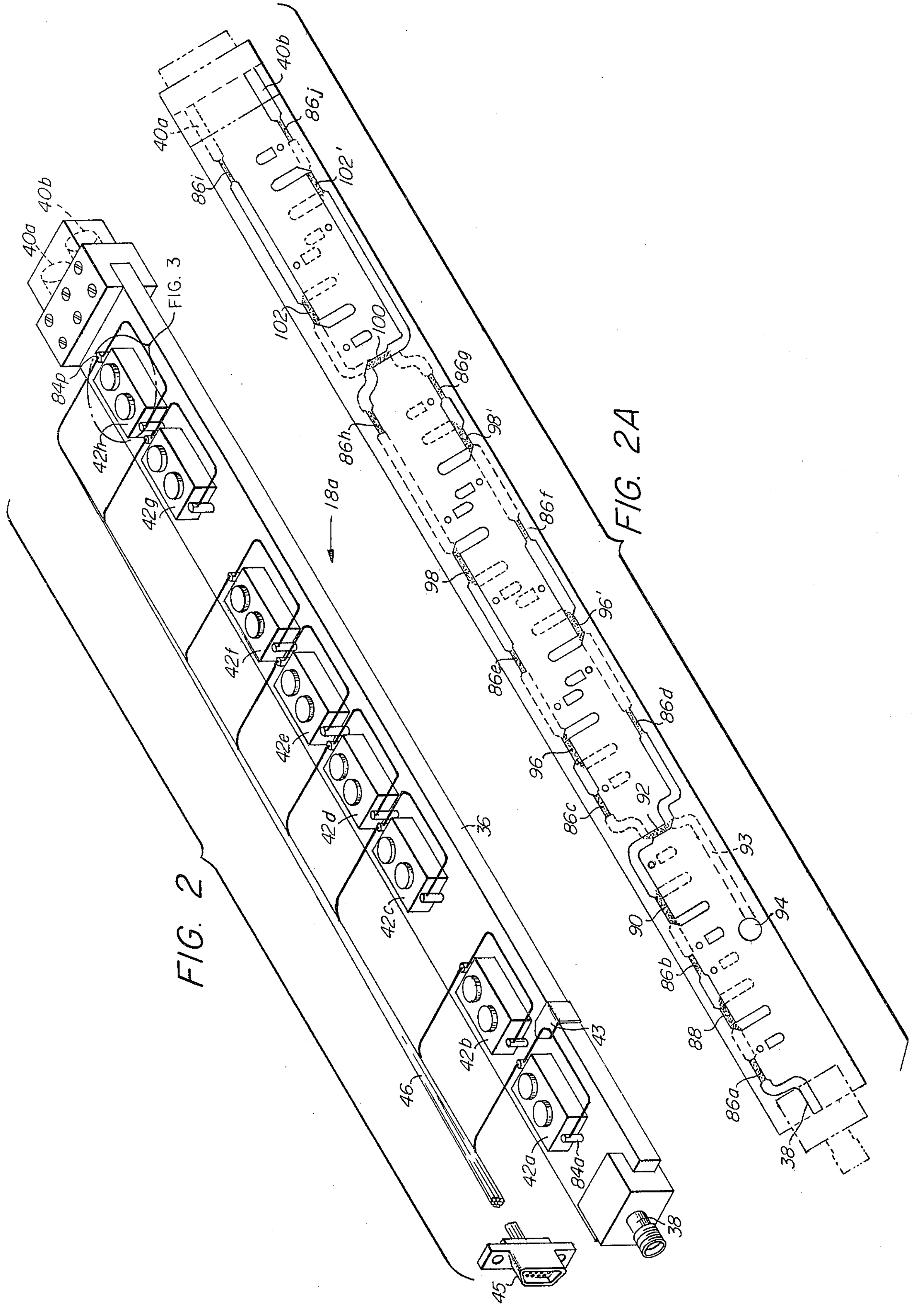
FIG. 2 is an isometric view of a phase shifter/polarization switch according to the invention.
FIG. 2A is a plan view of the circuitry of a phase shifter/polarization switch according to the invention.

Referring now to FIG. 1, it may be seen that an airborne radar system (not numbered) includes an antenna array 10 (the details of which will be explained with reference to FIG. 1A) and a plurality of phase shifter/-polarization switches 18a . . . 18n. A corporate feed network 20 including, but not showing, a monopulse arithmetic network (here of conventional design) provides radar energy from transmitter 28, to antenna array 10 via phase shifter/polarization switches 18a . . . 18n. Corporate feed network 20 also converts received signals into monopulse sum and difference signals for receiver 26 (here of conventional design). Output signals from receiver 26 are sent to utilization device 30 which is here a conventional display system. As is known, such an arrangement permits radio frequency energy from transmitter 28 to be collimated in a beam and directed in accordance with commands supplied by a beam steering computer 32. The operation of transmitter 28, receiver 26, and beam steering computer 32 is controlled by a conventional synchronizer 34.

Referring now to FIG. 1A, it may be seen that an exemplary antenna element 12 of antenna array 10 is comprised of a pair of orthogonally disposed stripline radiating elements 14, 16. The operation of such an array is explained in detail in U.S. Pat. No. 3,836,976, issued Sept. 17, 1974 and assigned to the same assignee as the present application. Suffice it to say here that coaxial cables (not numbered) from stripline radiating elements 14, 16 protrude through the ground plane (not numbered) for antenna array 10 and interface with polarization switches 18a . . . 18n.

Referring now to FIG. 2, an exemplary one of the phase shifter/polarization switches 18a . . . 18n comprises a plated stripline package 36, an input connector 38, a pair of output connectors 40a, 40b, a plurality of diode mounts 42a . . . 42h, a plurality of bias terminals 84a . . . 84p, a bias cable harness 46, including a connector 45, and a metal strip 43 whose purpose will be explained hereinafter. Each of said diode mounts 42a . . . 42h contains a pair of packaged P-I-N diodes, and each diode pair forms a single phase bit, as will be explained in greater detail hereinafter. An exemplary phase shifter/polarization switch 18a may be seen, therefore, to be comprised of eight phase bits which are here arranged in a serial fashion to provide a 22.5° bit, a 45° bit, a first pair of 90° bits, a pair of 180° bits and a second pair of 90° bits. The operation and interaction of each of said phase bits will be explained in greater detail hereinafter. Suffice it to say here that such arrangement is effective to provide, in combination, a four bit phase shifter and a polarization switch capable of providing an output signal with any selected one of six separate polarization senses.

Figure 3:
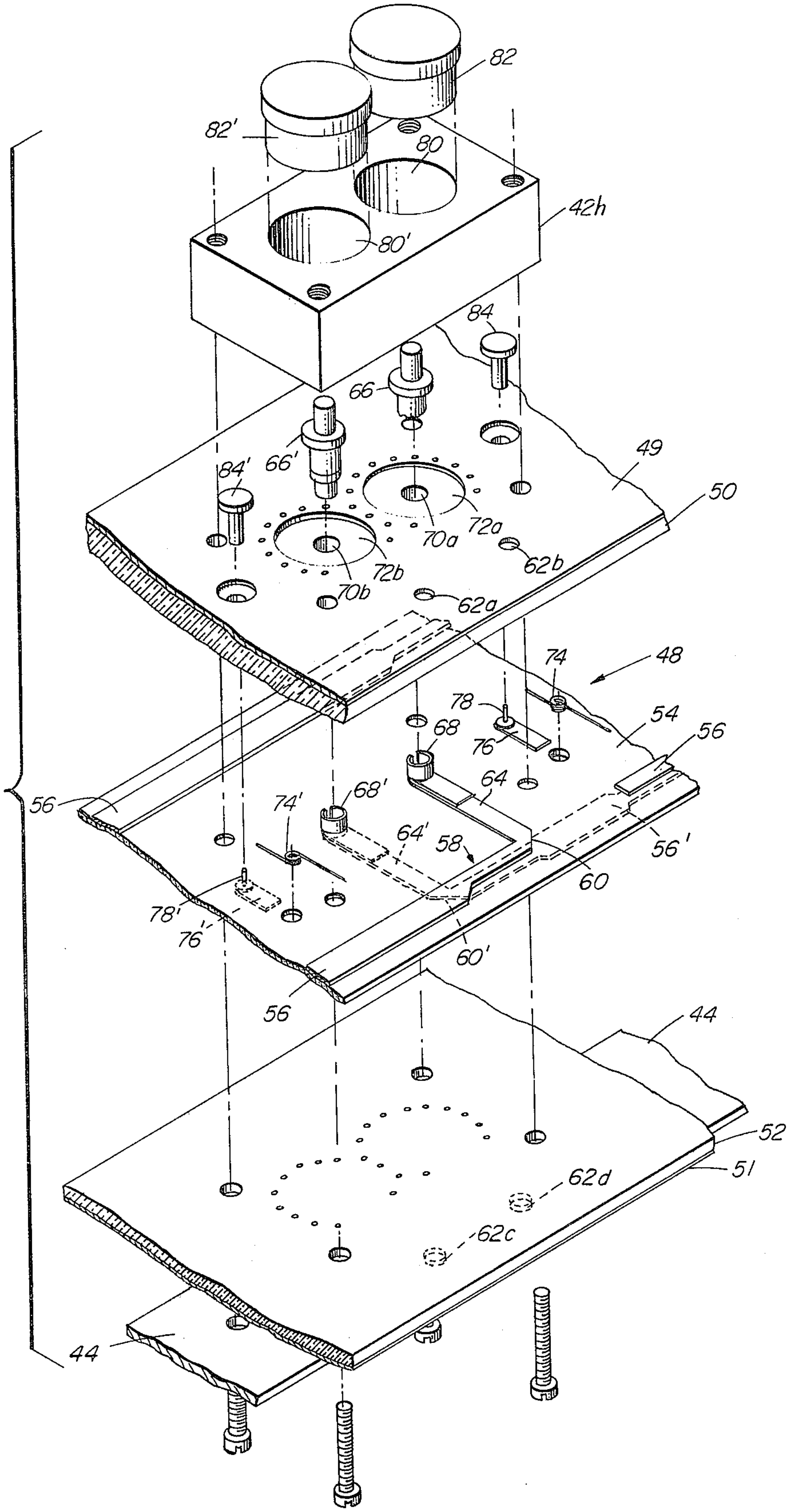
FIG. 3 is an isometric drawing, greatly simplified and exploded, of one of the phase bits of phase shifter/polarization switch of FIG. 2 according to the invention.

Referring now to FIG. 3, a single exemplary phase bit of the phase shifter/polarization switch 18a is shown to include a center conductor region 48 disposed between two sections 50, 52 of a dielectric material. The outer surfaces 49, 51 of sections 50, 52 have deposited or printed thereon a conducting material, here copper, to form ground planes for center conductor region 48. The center conductor region 48 is here formed by center conductor circuitry 56, 56' located, respectively, on the top and bottom surfaces of a thin (0.0076 inch) dielectric section 54. The center conductor circuitry 56, 56' is shown to overlap in such a manner as to form a 50 ohm quarter-wave hybrid coupler 58 (hereinafter sometimes referred to simply as hybrid coupler 58). As is known in the art, a diode phase shifter may be formed using such a hybrid coupler with symmetric reflecting diode terminations on the output arms. In such a device, if there is a 3 dB power split between the output arms, and said output arms are in phase quadrature, the phase shift increment through the device is dependent on the design of the reflecting diode terminations. The 90° phase difference between the output arms of a conventional quarter-wave hybrid coupler is relatively frequency independent; however, it has been found here that to obtain a full octave band performance, the quarter-wave hybrid coupler 58 must be designed to provide 2.7 dB coupling at center band.

Of equal importance in obtaining octave band performance from the hybrid coupler 58 is the effect of the discontinuities introduced by the mitered sections 60, 60'. As is known and described in "Microwave Filters, Impedance-Matching Networks, and Coupling Structures" by G. L. Matthaei, L. Young and E. M. T. Jones, published by McGraw-Hill Inc., New York, N. Y. 1964, (pages 796–797) capacitive screws, located symmetrically about the coupler, may be used to compensate for the discontinuities introduced by mitered sections 60, 60'. The required capacitive reactance is provided here by means of holes 62a . . . 62d, which are milled into sections 50, 52 and subsequently filled with plating material or conductive epoxy. The depth of the holes 62a . . . 62d and the length of the mitered sections 60, 60'were found to be critical and their optimum dimensions were determined to be 0.028 ± 0.001 and 0.100 ± 0.005 inches, respectively for a ground plane spacing of 0.001 = 0.002 inches. The length of the output arms 64, 64' hybrid coupler 58 were dimensioned such that P-I-N diodes 66, 66', terminating said arms, were arranged to lie along the centerline of each phase shifter/polarization switches, 18a . . . 18n. As P-I-N diode 66' is terminated at output arm 64', located on the bottom surface of dielectric section 54, the length of output arm 64' is made approximately 0.012 to 0.018 inches shorter than output arm 64 to account for the additional pathlength traversed by P-I-N diode 66' in passing through dielectric section 54. This modification is required to assure that the effective electrical lengths of the output arms 64, 64' remain symmetrical within hybrid coupler 58, thereby to minimize phase error and mismatch losses in the device.

As is known, a forward biased P-I-N diode approximates a short circuit and a reverse biased P-I-N diode approximates an open circuit. When a pair of P-I-N diodes terminating the output ports of a hydrid coupler is switched in parallel by changing the bias from a forward to a reverse condition, the phase of a signal traversing such coupler changes by an amount equal to that provided by the diodes being switched between the forward and reverse bias states. In general, for phase shifter applications the diodes are arranged such that they provide a short circuit termination in the forward bias state and an open circuit termination in the reverse bias state, and, therefore, such an arrangement will theoretically provide a 180° phase shift when switched between the forward and reverse bias states. In practice, P-I-N diodes do not provide either a perfect open or short circuit termination, and, therefore, as is explained in the above-referenced article by Terrio at al., by controlling the impedance at the diode terminations the phase shift between the forward and reverse bias states may be controlled. In the past shunt stubs and quarter-wave transformers have been used to control the impedance at the diode terminations; however, such devices are bandwidth limited and are large. It has been found here that satisfactory phase shift operation may be realized over an octave band by providing a prescribed impedance swing at the junctions between P-I-N diodes 66, 66' and output arms 64, 64' of hybrid coupler 58.

Such an impedance swing is here realized by using the combined impedance of the diode junctions and the diode package parasitic impedances. Table I gives combinations of both diode junction capacitance and diode package parameters which were found suitable for octave band performance over a 5 to 10 GHz band in a 50 ohm structure. The requirements are given for phase bit sizes of 22.5°, 45°, 90° and 180°. It was found that package style 30 diodes from GHz Devices, Inc., 16 Maple Road, Chelmsford, Mass. 01824 had suitable parasitics for the 180° phase bit, while package style 46 diodes from the same manufacturer had suitable parasitics for the 90° phase bit. Diode styles UN9338 and UN9339 from Unitrode Corp., 580 Pleasant Street, Watertown, Mass. 02172 were found to be suitable, respectively, for the 22.5° and 45° phase bits.

TABLE 1

REQUIRED P-I-N DIODE PARAMETERS FOR OCTAVE BAND PERFORMANCE

| Bit Size | Case Capacitance (pF) | Case Lead Inductance (nH) | Junction Capacitance (pF) | Series Resistance (OHMS) |
|---|---|---|---|---|
| 180° | .18 | 0.42 | .15 | <1.0 |
| 90° | .34 | 0.30 | .51 | <1.0 |
| 45° | .20 | 0.10 | 0.80 | <1.0 |
| 22.5° | .20 | 0.10 | 1.80 | <1.0 |

Referring back now to FIG. 3, diode contacts 68, 68' are connected (here by means of a high temperature solder not shown) to the ends of output arms 64, 64'. Diode contacts 68, 68' extend through holes **70*a*, 70*b*, provided in dielectric section 50, to engage the anode electrodes of P-I-N diodes 66, 66'. Circular areas 72*a*, 72*b*, formed by removing (here by etching) a portion of outer surface 49, are concentrically located about holes 70*a*, 70*b*. The diameters of diode contacts 68, 68' and circular areas 72*a*, 72*b* are dimensioned so as to approximate a 50 ohm coaxial structure. Mode suppression members (not numbered) are provided around circular areas 72*a*, 72*b* by means of plated holes extending from outer surface 49 through dielectric sections 50, 54 and 52 to outer surface 51**.

Bias voltage for P-I-N diodes 66, 66' is provided by means of octave band chokes comprising lumped inductors 74, 74' embedded inside dielectric section 54. Lumped inductors 74, 74' comprise three complete 360° turns of 0.0015 inch diameter copper wire coated with a suitable high temperature insulation material (not shown) and fitted with a dielectric core (not shown) having a relative dielectric constant of 1.8. Said dielectric core was formed from Stycast $L_oK$ Dielectric Foam, a product of Emerson & Cumming, Inc., Canton, Mass. Lumped inductors 74, 74' are attached (here by means of a high temperature solder) to metallic tabs 76, 76' located on opposite sides of dielectric section 54 and (also by means of a high temperature solder) to center conductor circuitry 56, 56'. Pins 78, 78' are also soldered to metallic tabs 76, 76' and extend through holes (not numbered) provided in dielectric section 50 and outer surface 49.

Once the diode contacts 68, 68', the lumped inductors 74, 74' and the pins 78, 78' are soldered in place, a composite stripline package is formed in any convenient manner. During the forming process, a layer of 0.0015 inch thick bonding film (not shown) is placed on both surfaces of dielectric section 54. This assembly is then placed in a bonding press (of conventional design), heated to a temperature of 420° ± 5° F, and bonded at a pressure of 100 psi. After bonding, the outside of the stripline package is plated (except for the holes mentioned above). P-I-N diodes 66, 66' are connected (here by means of a suitable conductive epoxy) to diode contacts 68, 68'. Diode mount **42*h* is then placed over P-I-N diodes 66, 66' and secured to support plate 44 by means of screws (not numbered) passing through the stripline package to tapped holes (not numbered) in diode mount 42*h*. The diameter of the cylindrical cavities 80, 80', formed in diode mount 42*h*, is chosen to approximate a 50 ohm coaxial structure with the P-I-N diodes 66, 66' forming the center conductor thereof. Two different diameters are required, one being approximately 0.250 inches for the 22.5°, 45° and 180° phase bits and the other being 0.230 inches for the 90° phase bit. Shorting caps 82, 82' with recesses (not shown) which are sized to fit over the cathode electrodes of diodes 66, 66' are bonded (by means of a suitable conductive epoxy) simultaneously to both the P-I-N diodes 66, 66' and diode mount 42*h*. Bias terminals 84, 84' are then connected together as shown in FIG. 2 and to the bias cable harness 46**.

Referring now to FIG. 2A, the composite phase shifter/polarization switch **18*a* is shown to be comprised of a plurality of serially coupled phase bits. The input connector 38 is coupled through a D.C. block 86*a* to a 22.5° phase bit 88. D.C. blocks 86*a* . . . 86*j* are formed by overlapping quarter-wave coupled stripline center conductors similar to the coupled lines in hybrid coupler 58 and are provided between adjacent bits. D.C. block 86*b* separates 22.5° phase bit 88 and 45° phase bit 90. The output from 45° phase bit 90 passes to a hybrid coupler 92 whose isolated port 93 is terminated in a 50 ohm stripline load 94. Stripline load 94 is here a Model EMC 92-125-T from EMC Technology, Inc., 1300 Arch Street, Philadelphia, Pa. 19107. Stripline load 94 is inserted after the bonding and plating processes. A section of dielectric material (not shown) is placed over stripline load 94. Metal strip 43 (FIG. 2) is placed over said dielectric material and soldered to the plated package in order to maintain ground plane continuity. The output arms (not numbered) from hybrid coupler 92 are connected through D.C. blocks 86*c*, 86*d* to 90° phase bits 96, 96' and then through D.C. blocks 86*e*, 86*f* to 180° phase bits 98, 98'. The 180° phase bits 98, 98' are connected through D.C. blocks 86*g*, 86*h* to a hybrid coupler 100 and then through 90° phase bits 102, 102' and D.C. blocks 86*i*, 86*j* to output connectors 40*a*, 40*b***.

Referring now to FIG. 4, the operation of the polarization switch section of the phase shifter/polarization switch **18*a* will be explained. Throughout the following discussion when the diodes associated with a particular phase bit are referred to as being back-biased, zero phase shift through that bit is assumed and the bit is referred to as being in the "OFF" state. Conversely, when the diodes associated with a phase bit are forward biased, such phase bit will provide a phase shift to a signal passing therethrough and the bit is referred to as being in the "ON" state. Presented in Table 2 are the required phase bit settings for each of the six polarization senses which may be provided by phase shifter/polarization switch 18*a***. The two diagonal polarizations represent polarized signals disposed 90° apart in space and two circular polarizations represent left or right hand circular polarization.

As mentioned hereinabove, the phase shifter/polarization switch 18a interfaces with an antenna element 12 comprised of a pair of orthogonally disposed stripline radiators 14, 16. For either vertical or horizontal linear polarization only one of said stripline radiators will be energized.

TABLE 2

PHASE SETTING FOR POLARIZATION SWITCHING

| Polarization Sense | PHASE BIT NUMBER (FIG. 4) 110 | 112 | 114 | 116 | 118 | 120 |
|---|---|---|---|---|---|---|
| Vertical | OFF | ON | OFF | OFF | OFF | OFF |
| Horizontal | OFF | OFF | OFF | OFF | OFF | OFF |
| Diagonal (1) | ON | OFF | OFF | OFF | OFF | OFF |
| Diagonal (2) | OFF | ON | OFF | ON | OFF | OFF |
| Circular (1) | ON | OFF | ON | OFF | OFF | OFF |
| Circular (2) | ON | OFF | OFF | OFF | OFF | ON |

Let us now consider the case where vertical polarization is required. Referring to Table 2 and FIG. 4, it is seen that for this condition only phase bit 112 in "ON". The signals in transmission line sections 113, 115 are in phase quadrature having traversed hybrid coupler 111. The signal in transmission line section 115 will be considered to phase lag the signal in transmission line section 113. (The same convention will be used throughout the following discussion, i.e. any signal traversing hybrid coupler 117 from transmission line section 113 to transmission line section 123 will phase lag by 90° any signal traversing hybrid coupler 117 from transmission line section 113 to transmission line section 121; and, conversely, any signal traversing hybrid coupler 117 from transmission line section 115 to transmission line section 121 will phase lag by 90 degrees any signal traversing hybrid coupler 117 from transmission line section 115 to transmission line section 123.) As both phase bits 110, 116 are "OFF", there is no additional relative phase shift through these bits. On traversing phase bit 112, which is "ON", the signal in transmission line section 113 experiences a 180° phase delay relative to the signal in transmission line section 115 as phase bit 118 is "OFF". Therefore, the signals on transmission line sections 113, 115 just prior to hybrid coupler 117 have been phase delayed 180° and 90°, respectively. As mentioned hereinabove, the signal in transmission line section 113 will experience no additional phase delay in traversing hybrid coupler 117 to transmission line section 121. The signal from transmission line section 115 in traversing hybrid coupler 117 to transmission line section 121 experiences an additional 90° phase delay and therefore arrives at transmission line section 121 phase delayed by 180°. The signals in transmission line section 121 are therefore in phase and they combine to produce a signal on output port 122. Conversely, the signal from transmission line section 113 experiences an additional phase delay of 90° in traversing hybrid coupler 117 and arrives at transmission line section 123 with a total relative phase delay of 270°. The signal from transmission line section 115 passes through hybrid coupler 117 to transmission line section 123 without any additional phase delay and arrives with a total relative phase delay of 90°. The signals in transmission line section 123 are, therefore, 180° out-of-phase and they cancel, providing no signal at output arm 124.

Having described the operation of the polarization switch portion of phase shifter/polarization switch 18a to provide vertical polarization, with the phase shifter/polarization switch 18a set, as shown in Table 2, for horizontal polarization, the signals will cancel and combine in a similar manner to provide an output signal at only output arm 124. For all remaining polarization senses, output signals will be obtained at both output arms 122, 124.

Once a particular polarization sense is selected, the phase delay through the phase shifter/polarization switch 18a may be set, in 22.5° increments, to a selected one of sixteen separate values. It should be noted here that 90° phase bits 114, 120 are utilized only for providing either sense of circular polarization and only the remaining six phase bits are used in controlling the phase delay through the phase shifter/polarization switch 18a. A moment's thought will make it clear that both senses of circular polarization could be realized using only a single 90° phase bit. A pair of 90° bits was used here to prevent a large phase and amplitude unbalance which would result in unacceptable axial ratios. The settings of phase shifter/polarization switch 18a which provides, for each polarization sense, the sixteen incremental phase delays are tabulated in Tables 3 to 8. In the Tables, a "0" indicates an "OFF" condition and a "1" indicates an "ON" condition. The various settings listed are controlled here by beam steering computer 32.

Having described a preferred embodiment of the invention, it will now be apparent to those having ordinary skill in the art that the phase shifter/polarization switch 18a may be modified to provide solely linear or circular polarization or a combination of linear and diagonal polarization. For example, if a combination of linear and diagonal polrization were desired, such a device could be realized by removing 90° phase bits 114, 120. If only circular polarization were desired, only five phase bits and a single 90° hybrid coupler, located between the 90° bit and a pair of 180° bits, would be required. Additionally, if only linear polarization were desired, five phase bits and a pair of 90° hybrid couplers located, respectively, on the input and output terminals of a pair of 180° bits would be required. Further, for convenience in driver design, microwave N-I-P diodes may be substituted for the microwave P-I-N diodes hereinabove. Still further, while the diodes were mounted orthogonally to the stripline circuitry in the particularly embodiment described herein, the diodes could just as well have been mounted in line with the stripline circuitry without affecting the performance of the device. It is felt, therefore, that the invention should not be restricted to its disclosed embodiment but rather should be limited only by the spirit and scope of the following claims.

POLARIZATION SENSE VERTICAL

| Phase Delay | PHASE BIT NUMBERS 22.5° | 45° | 110 | 112 | 114 | 116 | 118 | 120 |
|---|---|---|---|---|---|---|---|---|
| 0° | 0 | 0 | 0 | 1 | 0 | 0 | 0 | 0 |
| 22.5° | 1 | 0 | 0 | 1 | 0 | 0 | 0 | 0 |
| 45° | 0 | 1 | 0 | 1 | 0 | 0 | 0 | 0 |
| 67.5° | 1 | 1 | 0 | 1 | 0 | 0 | 0 | 0 |
| 90° | 0 | 0 | 1 | 1 | 0 | 1 | 0 | 0 |
| 112.5° | 1 | 0 | 1 | 1 | 0 | 1 | 0 | 0 |
| 135° | 0 | 1 | 1 | 1 | 0 | 1 | 0 | 0 |
| 157.5° | 1 | 1 | 1 | 1 | 0 | 1 | 0 | 0 |
| 180° | 0 | 0 | 0 | 0 | 0 | 0 | 1 | 0 |
| 202.5° | 1 | 0 | 0 | 0 | 0 | 0 | 1 | 0 |
| 225° | 0 | 1 | 0 | 0 | 0 | 0 | 1 | 0 |
| 247.5° | 1 | 1 | 0 | 0 | 0 | 0 | 1 | 0 |
| 270° | 0 | 0 | 1 | 0 | 0 | 1 | 1 | 0 |
| 292.5° | 1 | 0 | 1 | 0 | 0 | 1 | 1 | 0 |
| 315° | 0 | 1 | 1 | 0 | 0 | 1 | 1 | 0 |
| 337.5° | 1 | 1 | 1 | 0 | 0 | 1 | 1 | 0 |

POLARIZATION SENSE HORIZONTAL

| Phase Delay | PHASE BIT NUMBERS 22.5° | 45° | 110 | 112 | 114 | 116 | 118 | 120 |
|---|---|---|---|---|---|---|---|---|
| 0° | 0 | 0 | 0 | 0 | 0 | 0 | 0 | 0 |
| 22.5° | 1 | 0 | 0 | 0 | 0 | 0 | 0 | 0 |
| 45° | 0 | 1 | 0 | 0 | 0 | 0 | 0 | 0 |
| 67.5° | 1 | 1 | 0 | 0 | 0 | 0 | 0 | 0 |
| 90° | 0 | 0 | 1 | 0 | 0 | 1 | 0 | 0 |
| 112.5° | 1 | 0 | 1 | 0 | 0 | 1 | 0 | 0 |
| 135° | 0 | 1 | 1 | 0 | 0 | 1 | 0 | 0 |
| 157.5° | 1 | 1 | 1 | 0 | 0 | 1 | 0 | 0 |
| 180° | 0 | 0 | 0 | 1 | 0 | 0 | 1 | 0 |
| 202.5° | 1 | 0 | 0 | 1 | 0 | 0 | 1 | 0 |
| 225° | 0 | 1 | 0 | 1 | 0 | 0 | 1 | 0 |
| 247.5° | 1 | 1 | 0 | 1 | 0 | 0 | 1 | 0 |
| 270° | 0 | 0 | 1 | 1 | 0 | 1 | 1 | 0 |
| 292.5° | 1 | 0 | 1 | 1 | 0 | 1 | 1 | 0 |
| 315° | 0 | 1 | 1 | 1 | 0 | 1 | 1 | 0 |
| 337.5° | 1 | 1 | 1 | 1 | 0 | 1 | 1 | 0 |

POLARIZATION SENSE DIAGONAL (1)

| Phase Delay | PHASE BIT NUMBERS 22.5° | 45° | 110 | 112 | 114 | 116 | 118 | 120 |
|---|---|---|---|---|---|---|---|---|
| 0° | 0 | 0 | 1 | 0 | 0 | 0 | 0 | 0 |
| 22.5° | 1 | 0 | 1 | 0 | 0 | 0 | 0 | 0 |
| 45° | 0 | 1 | 1 | 0 | 0 | 0 | 0 | 0 |
| 67.5° | 1 | 1 | 1 | 0 | 0 | 0 | 0 | 0 |
| 90° | 0 | 0 | 0 | 1 | 0 | 1 | 0 | 0 |
| 112.5° | 1 | 0 | 0 | 1 | 0 | 1 | 0 | 0 |
| 135° | 0 | 1 | 0 | 1 | 0 | 1 | 0 | 0 |
| 157.5° | 1 | 1 | 0 | 1 | 0 | 1 | 0 | 0 |
| 180° | 0 | 0 | 1 | 1 | 0 | 0 | 1 | 0 |
| 202.5° | 1 | 0 | 1 | 1 | 0 | 0 | 1 | 0 |
| 225° | 0 | 1 | 1 | 1 | 0 | 0 | 1 | 0 |
| 247.5° | 1 | 1 | 1 | 1 | 0 | 0 | 1 | 0 |
| 270° | 0 | 0 | 0 | 0 | 0 | 1 | 1 | 0 |
| 292.5° | 1 | 0 | 0 | 0 | 0 | 1 | 1 | 0 |
| 315° | 0 | 1 | 0 | 0 | 0 | 1 | 1 | 0 |
| 337.5° | 1 | 1 | 0 | 0 | 0 | 1 | 1 | 0 |

POLARIZATION SENSE DIAGONAL (2)

| Phase Delay | PHASE BIT NUMBERS 22.5° | 45° | 110 | 112 | 114 | 116 | 118 | 120 |
|---|---|---|---|---|---|---|---|---|
| 0° | 0 | 0 | 0 | 1 | 0 | 1 | 0 | 0 |
| 22.5° | 1 | 0 | 0 | 1 | 0 | 1 | 0 | 0 |
| 45° | 0 | 1 | 0 | 1 | 0 | 1 | 0 | 0 |
| 67.5° | 1 | 1 | 0 | 1 | 0 | 1 | 0 | 0 |
| 90° | 0 | 0 | 1 | 0 | 0 | 0 | 0 | 0 |
| 112.5° | 1 | 0 | 1 | 0 | 0 | 0 | 0 | 0 |
| 135° | 0 | 1 | 1 | 0 | 0 | 0 | 0 | 0 |
| 157.5° | 1 | 1 | 1 | 0 | 0 | 0 | 0 | 0 |
| 180° | 0 | 0 | 0 | 0 | 0 | 1 | 1 | 0 |
| 202.5° | 1 | 0 | 0 | 0 | 0 | 1 | 1 | 0 |
| 225° | 0 | 1 | 0 | 0 | 0 | 1 | 1 | 0 |
| 247.5° | 1 | 1 | 0 | 0 | 0 | 1 | 1 | 0 |
| 270° | 0 | 0 | 1 | 1 | 0 | 0 | 1 | 0 |
| 292.5° | 1 | 0 | 1 | 1 | 0 | 0 | 1 | 0 |
| 315° | 0 | 1 | 1 | 1 | 0 | 0 | 1 | 0 |
| 337.5° | 1 | 1 | 1 | 1 | 0 | 0 | 1 | 0 |

POLARIZATION SENSE CIRCULAR (1)

| Phase Delay | PHASE BIT NUMBERS 22.5° | 45° | 110 | 112 | 114 | 116 | 118 | 120 |
|---|---|---|---|---|---|---|---|---|
| 0° | 0 | 0 | 1 | 0 | 1 | 0 | 0 | 0 |
| 22.5° | 1 | 0 | 1 | 0 | 1 | 0 | 0 | 0 |
| 45° | 0 | 1 | 1 | 0 | 1 | 0 | 0 | 0 |
| 67.5° | 1 | 1 | 1 | 0 | 1 | 0 | 0 | 0 |
| 90° | 0 | 0 | 0 | 1 | 1 | 1 | 0 | 0 |
| 112.5° | 1 | 0 | 0 | 1 | 1 | 1 | 0 | 0 |
| 135° | 0 | 1 | 0 | 1 | 1 | 1 | 0 | 0 |
| 157.5° | 1 | 1 | 0 | 1 | 1 | 1 | 0 | 0 |
| 180° | 0 | 0 | 1 | 1 | 1 | 0 | 1 | 0 |
| 202.5° | 1 | 0 | 1 | 1 | 1 | 0 | 1 | 0 |
| 225° | 0 | 1 | 1 | 1 | 1 | 0 | 1 | 0 |
| 247.5° | 1 | 1 | 1 | 1 | 1 | 0 | 1 | 0 |
| 270° | 0 | 0 | 0 | 0 | 1 | 1 | 1 | 0 |
| 292.5° | 1 | 0 | 0 | 0 | 1 | 1 | 1 | 0 |
| 315° | 0 | 1 | 0 | 0 | 1 | 1 | 1 | 0 |

-continued

POLARIZATION SENSE CIRCULAR (1)

| Phase Delay | PHASE BIT NUMBERS 22.5° | 45° | 110 | 112 | 114 | 116 | 118 | 120 |
|---|---|---|---|---|---|---|---|---|
| 337.5° | 1 | 1 | 0 | 0 | 1 | 1 | 1 | 0 |

POLARIZATION SENSE CIRCULAR (2)

| Phase Delay | PHASE BIT NUMBERS 22.5° | 45° | 110 | 112 | 114 | 116 | 118 | 120 |
|---|---|---|---|---|---|---|---|---|
| 0° | 0 | 0 | 1 | 0 | 0 | 0 | 0 | 1 |
| 22.5° | 1 | 0 | 1 | 0 | 0 | 0 | 0 | 1 |
| 45° | 0 | 1 | 1 | 0 | 0 | 0 | 0 | 1 |
| 67.5° | 1 | 1 | 1 | 0 | 0 | 0 | 0 | 1 |
| 90° | 0 | 0 | 0 | 1 | 0 | 1 | 0 | 1 |
| 112.5° | 1 | 0 | 0 | 1 | 0 | 1 | 0 | 1 |
| 135° | 0 | 1 | 0 | 1 | 0 | 1 | 0 | 1 |
| 157.5° | 1 | 1 | 0 | 1 | 0 | 1 | 0 | 1 |
| 180° | 0 | 0 | 1 | 1 | 0 | 0 | 1 | 1 |
| 202.5° | 1 | 0 | 1 | 1 | 0 | 0 | 1 | 1 |
| 225° | 0 | 1 | 1 | 1 | 0 | 0 | 1 | 1 |
| 247.5° | 1 | 1 | 1 | 1 | 0 | 0 | 1 | 1 |
| 270° | 0 | 0 | 0 | 0 | 0 | 1 | 1 | 1 |
| 292.5° | 1 | 0 | 0 | 0 | 0 | 1 | 1 | 1 |
| 315° | 0 | 1 | 0 | 0 | 0 | 1 | 1 | 1 |
| 237.5° | 1 | 1 | 0 | 0 | 0 | 1 | 1 | 1 |

What is claimed is:

1. In a directional antenna for radio frequency energy, such antenna including an array of pairs of cross-polarized radiators, each one of such radiators being selectively actuable to determine both the direction in which a beam of radio frequency energy is propagated and the polarization of the radio frequency energy in such a beam, a broad band feed arrangement for each pair of cross-polarized radiators comprising:

(a) a section of stripline having a first and a second hybrid coupler formed therein, the first one of such couplers being disposed to be actuated by radio frequency energy to be radiated and the second one of such couplers being disposed to be actuated by radio frequency energy out of the orthogonal ports of the first such coupler;

(b) a first plurality of diode phase shifters, each one thereof being arranged, when actuated, to shift the phase of radio frequency energy passing therethrough by a multiple of 90°, serially connected between a first orthogonal port of the first hybrid coupler and a first input port of the second hybrid coupler;

(c) a second plurality of diode phase shifters, each one thereof being arranged, when actuated, to shift the phase of radio frequency energy passing therethrough by a multiple of 90°, serially connected between a second orthogonal port of the first hybrid coupler and a second input port of the second hybrid coupler;

(d) a pair of diode phase shifters, each one thereof being arranged, when actuated, to shift the phase of radio frequency energy passing therethrough by 90°, disposed in the path of radio frequency energy out of the orthogonal arms of the second hybrid coupler;

(e) means for connecting radio frequency energy out of each one of the pair of diode phase shifters to a different one of the cross-polarized radiators; and (f) means for selectively actuating selected ones of the first and second plurality of diode phase shifters and the pair of diode phase shifters to shift the phase of radio frequency energy to the cross-polarized radiators, thereby to produce a selected polarization of radio frequency energy radiated from such radiators.

2. A broadband feed arrangement as in claim 1 having, additionally:

(a) a third plurality of diode phase shifters, each one thereof being arranged, when actuated, to shift the phase of radio frequency energy passing therethrough by a submultiple of 90°, serially connected to an input port of the first hybrid coupler; and (b) means for selectively actuating individual ones of the first, the second and the third plurality of diode phase shifters to adjust the phase, relative to the phase of radio frequency energy entering the second plurality of diode phase shifters, of the radio frequency energy at the cross-polarized radiators.

3. The broadband feed arrangement of claim 2 having, additionally, means disposed in the stripline section adjacent to the first and the second hybrid couplers for capacitively loading each one of such couplers.

* * * * *